United States Patent [19]
Wollesen et al.

[11] Patent Number: 5,136,361
[45] Date of Patent: Aug. 4, 1992

[54] STRATIFIED INTERCONNECT STRUCTURE FOR INTEGRATED CIRCUITS

[75] Inventors: Donald L. Wollesen, Saratoga; Craig S. Sander, Cupertino; Jacob D. Haskell, Palo Alto, all of Calif.

[73] Assignee: Advanced Micro Devices, Inc., Sunnyvale, Calif.

[21] Appl. No.: 338,439

[22] Filed: Apr. 13, 1989

Related U.S. Application Data

[63] Continuation of Ser. No. 858,530, Apr. 23, 1986, abandoned, which is a continuation of Ser. No. 430,188, Sep. 30, 1982, abandoned.

[51] Int. Cl.$^5$ ............................................. H01L 23/54
[52] U.S. Cl. ......................................... 357/67; 357/71; 357/2
[58] Field of Search ........................ 357/71, 67, 4, 1

[56] References Cited

U.S. PATENT DOCUMENTS

| | | | |
|---|---|---|---|
| 3,614,547 | 10/1971 | May | 357/67 |
| 3,881,971 | 5/1975 | Greer et al. | 357/67 |
| 4,057,659 | 11/1977 | Pammer et al. | 357/715 |
| 4,128,670 | 12/1978 | Gaensslen | 357/71 |
| 4,146,413 | 3/1979 | Yonezawa et al. | 357/71 |
| 4,180,596 | 12/1979 | Crowder et al. | 357/71 |
| 4,276,557 | 6/1981 | Levinstein et al. | 357/71 |
| 4,348,746 | 9/1982 | Okabayashi et al. | 6357/71 |
| 4,486,946 | 12/1984 | Jopke, Jr. et al. | 437/177 |

FOREIGN PATENT DOCUMENTS

2087148 5/1982 United Kingdom .

OTHER PUBLICATIONS

Murarka et al. "Refractory Silicides of Titanium and Tantalum for Low-Resistivity Gates and Interconnects," IEEE Journal of Solid-State Circuits, vol. SC-15, No. 4, Aug. 1980.
Vlack, *Elements of Materials Science*-Addison-Wesley Publishing, 1959, pp. 77-79.
"Aluminum-Silicon Conductor Formation" Leff-IBM Technical Disclosure Bulletin-vol. 12. No. 11 Apr. 1970 p. 1996.

*Primary Examiner*—Rolf Hille
*Assistant Examiner*—S. V. Clark
*Attorney, Agent, or Firm*—Fliesler, Dubb, Meyer & Lovejoy

[57] ABSTRACT

A low resistance interconnect structure for integrated circuits formed by a composite layer of aluminum below and an amorphous compound of refractory metal and silicon above. In the process of manufacturing the interconnect structure, care must be taken so that an aluminum oxide layer is not formed between the aluminum and compound layers.

12 Claims, 3 Drawing Sheets

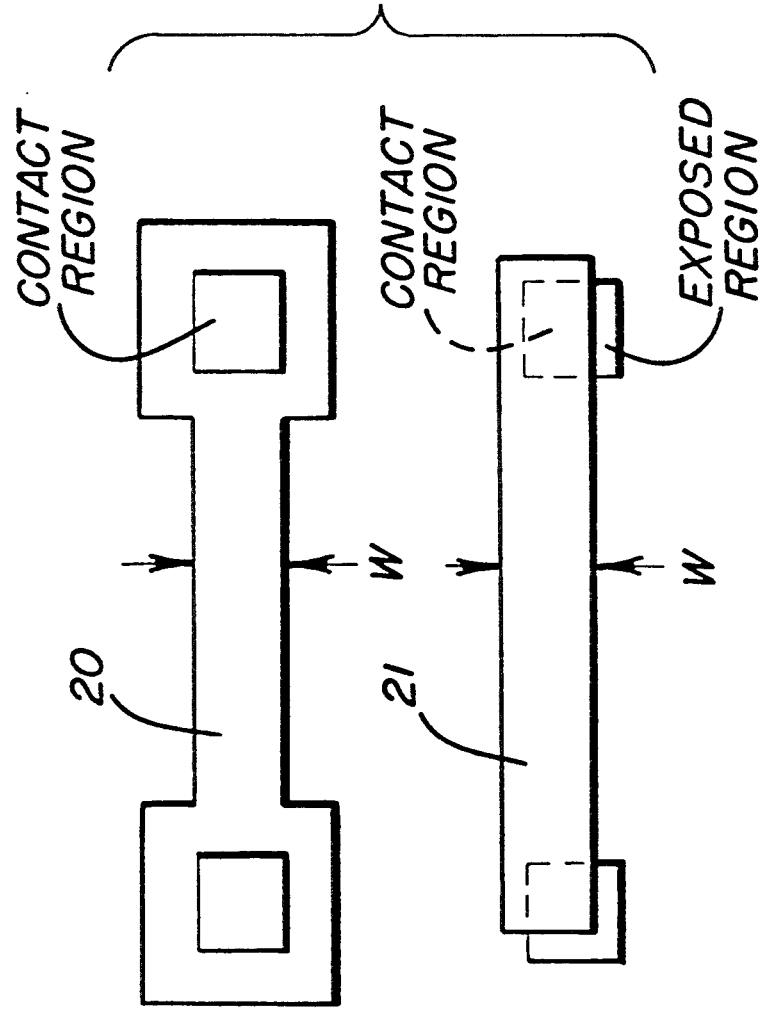

STRATIFIED INTERCONNECT STRUCTURE FOR INTEGRATED CIRCUITS

This application is a continuation of Ser. No. 858,530, filed Apr. 23, 1986, now abandoned, which is a continuation of Ser. No. 430,188, filed Sep. 30, 1982 now abandoned.

BACKGROUND OF THE INVENTION

1. Field of the Invention

This invention relates to an interconnect structure for integrated circuit devices and, more particularly, to a low-resistance aluminum-metal and silicon compound interconnect structure for connecting elements within an integrated circuit and to a method of manufacturing the interconnect structure.

2. Background of the Prior Art

Most integrated circuits are formed by active regions at the surface of a semiconductor substrate, typically, on monocrystalline silicon. These active regions are interconnected in part by conducting regions formed at the surface of the substrate. Other interconnecting lines are formed by the deposition of a conducting layer over an insulating layer covering the surface of the substrate. The conducting layer is delineated into interconnecting lines which contact the active regions of the substrate at preselected locations through holes in the insulating layer. Some integrated circuits have another insulating layer covering the interconnecting lines upon which a second set of interconnecting lines is formed. This second interconnecting layer contacts the interconnecting layer below through holes in the second insulating layer or may contact the substrate itself through holes in the first and second insulating layers.

Still more complex integrated circuits have more alternating layers of insulation and conducting material to form more sets of interconnecting lines. Generally, though, most complex integrated circuits have two sets of interconnecting lines, a top layer and an intermediate layer.

These interconnecting lines form the interconnect structure by which the elements, active and passive, of the integrated circuit are electrically coupled for the functioning of the circuit.

In present integrated circuits, the top conducting layer is usually formed from aluminum. The intermediate conducting layer or layers below the top conducting layer are formed from aluminum or polysilicon. Another material which has been examined as a possible candidate for intermediate conducting layers is some refractory metal silicide. All of these materials have various shortcomings.

Refractory metal silicides and polysilicon have the same general shortcomings as intermediate conducting layers. These materials, for example, have high sheet resistances compared with aluminum. Polysilicon sheet resistance is usually equal to or greater than fifteen ohms per square and silicides have sheet resistances usually equal to or greater than three ohms per square. Such high sheet resistances slow down the speed of integrated circuits. Secondly, these materials typically form high resistance or nonohmic contacts with either or both N+ or P+ regions in the substrate of the semiconductor substrate. In CMOS technology both N+ and P+ regions must contact the conducting lines. Polysilicon and refractory metal silicide interconnecting lines are particularly troublesome because the P or N doping of the interconnecting lines will create a P-N junction with an oppositely doped contact substrate region normally found in a CMOS layout.

A metal silicide or polysilicon interconnecting line must completely cover the contact region to the substrate, sometimes called "dog boning". The complete overlapping of the contact area by the silicide or polysilicon interconnecting line prevents the silicon substrate surface from gouging because etchants for polysilicon and silicides typically will also etch silicon. Gouging of the substrate silicon is avoided by "dog boning" the interconnecting layer to completely cover the contact region, even with the occurrence of masking misalignments. However, this reduces the density of the integrated circuit. See FIG. 2 which illustrates an interconnection line 20 having "dog bone" contacts and a line 21 which does not. It is easy to see that a set of interconnecting lines having "dog bone" contacts could be less tightly integrated compared to interconnecting lines of the same width W.

Another disadvantageous requirement for refractory metal silicide and polysilicon interconnecting lines is that of high temperature annealing. Any high temperature annealing step, normally at or above 900° C., will cause the junction depths of the doped regions of the silicon substrate to diffuse deeper. This increases the parasitic capacitances in the integrated circuit which ultimately reduces its speed.

Another material which has been used in the prior art for an intermediate interconnect layer to avoid the problems above is aluminum. Aluminum has the disadvantage of having bumps on its surface which cause the insulating layer placed over the aluminum to have hillocks. These hillocks, or irregularities, may cause interdielectric short circuits between the intermediate conducting layer and the conducting layer above.

Aluminum also does not provide adequate step coverage in many applications. For example, when aluminum is deposited on the insulating layer covering the substrate, it will not deposit evenly on the sides of a contact opening to the substrate. Rather, the aluminum tends to accumulate in certain places and avoid other places, thereby increasing the likelihood of open circuits in the interconnecting lines formed.

Furthermore, since present day production technology has not yet produced a totally satisfactory plasma etch for aluminum, wet etching is still widely used. Wet etching results in a large masking pitch between neighboring aluminum interconnect lines. This reduces the overall density of the integrated circuit.

Another disadvantage of aluminum is that the material when in contact with silicon, readily absorbs silicon to form an aluminum-silicon compound. This increases the possibility of aluminum spiking into the substrate through shallow P-N junctions used in present day MOS VLSI integrated circuits to cause short circuits.

Still another disadvantage of an intermediate aluminum interconnect layer is that it does not permit the reworking of the top aluminum layer when mistakes in photolithography occur. Since both materials are aluminum, the task of removing the top layer without affecting the intermediate interconnect layer becomes very difficult, if not impossible. An etch of the top layer will invariably remove part of the intermediate layer where contact is made between the two layers.

Finally, since both interconnection layers are aluminum, the top layer is required to have a "dog bone" contact to the lower aluminum layer. Otherwise, the exposed open contact area of the lower aluminum layer will be etched when the top layer is defined into interconnecting lines. As mentioned previously, this increases the masking pitch of the top aluminum layer and reduces the overall density of the integrated circuit.

The present invention overcomes or substantially mitigates these semiconductor process, structural and electrical shortcomings.

SUMMARY OF THE INVENTION

The present invention provides an interconnect structure for integrated circuit having a layer of aluminum and a layer of an amorphous compound of refractory metal and silicon on the aluminum layer to form composite layer. Ranges of suitable thicknesses for the aluminum and compound layers are also provided. Molybdenum and tantalum may be used as the refractory metal in the compound layer.

BRIEF DESCRIPTION OF THE DRAWINGS

A more detailed understanding of the present invention may be achieved by the perusal of the following detailed specifications and reference to the following drawings:

FIG. 2 is a top view of an interconnecting line having two "dog bone" contacts and an interconnecting line without such contacts.

DETAILED DESCRIPTION

An embodiment for manufacturing the novel interconnect structure is described in FIGS. 1A to 1E.

Figure 1A:
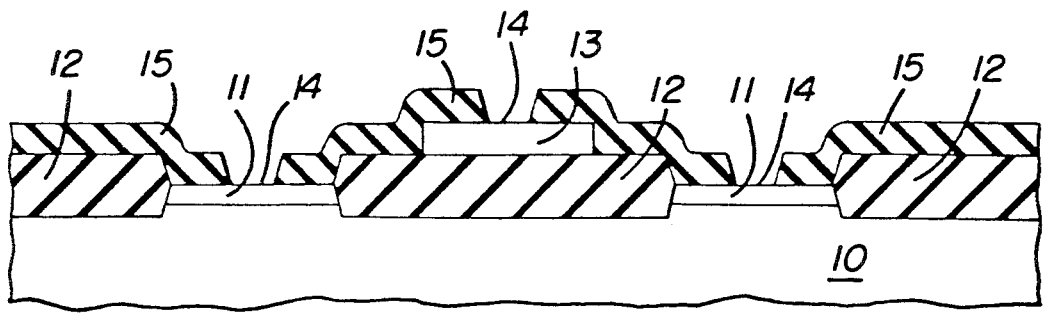
FIGS. 1A to 1E detail the steps of a process used in forming a novel integrated circuit device structure having a triple layer of interconnecting lines of polysilicon, aluminum-refractory metal and silicon compound, and aluminum.

FIG. 1A illustrates the state of a semiconductor wafer 10 just before an intermediate aluminum-metal and silicon compound interconnection is deposited. The substrate 10 has active or diffused regions 11, which are regions heavily doped with N or P type impurities, formed within the surface of substrate 10. Separating these regions 11 are insulating field oxide regions 12. To further isolate the active regions 11, field implant regions, or channel stops, may be placed under the field oxide layers 12. These are not shown in FIG. 1A. An optional conducting layer 13 of polysilicon is deposited upon the field oxide layer 12 to add another set of interconnecting lines to the completed integrated circuit. Over the entire surface of a processed substrate is deposited a layer of silicon dioxide 15. A typical way of deposition is by chemical vapor deposition. Holes 14 are then formed in the oxide layer 15 to expose the active regions 11 and the polysilicon layer 13.

Figure 1B:
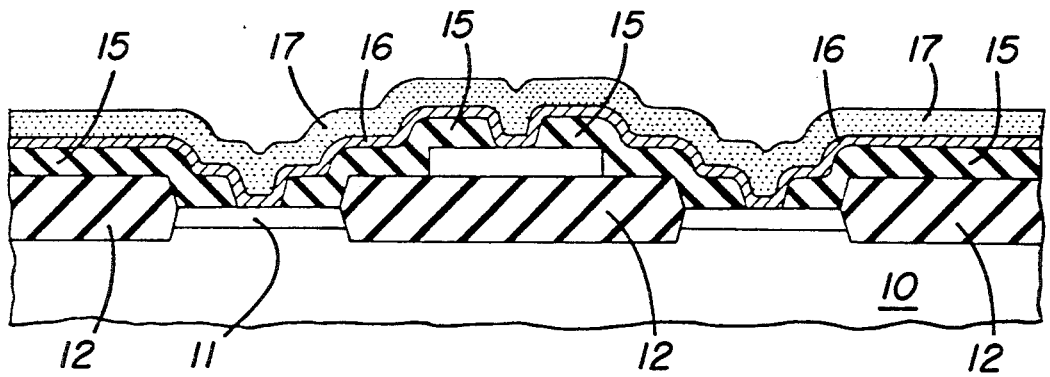

FIG. 1B shows a deposited aluminum-metal and silicon compound composite layer. The composite layer is formed from a thin aluminum layer 16 and an overlying layer of a (a)n amosphous compound of refractory metal and silicon 17. The layer of aluminum 16 is deposited by sputtering; other deposition techniques may be used. Pure aluminum or aluminum with small amounts of silicon or copper have been found to be satisfactory for the layer 16.

The aluminum-deposition is followed by the sputter deposition of the refractory metal and silicon compound layer 17. Molybdenum and tantalum have been used successfully as the refractory metal material. Other refractory metals may also be suitable.

The dictionary defines a "silicide" as a "compound of silicon with another element or radical" [Webster's II, Riverside Publishing Co., copyright 1984]. In the semiconductor industry, however, the term "silicide" is commonly taken to refer to annealed compounds where the temperature used to form a more or less homogeneous silicide is at least 700 degrees centigrade, and preferably more than 900 degrees centigrade. This is, in fact, a misnomer since no dictionary definition has been found which requires such annealing. As will be recognized by one skilled in the art, common sputter deposition temperatures used in the present invention and the fabrication temperatures of subsequent process steps, e.g., passivation or packaging, are far below this temperature. The compound formed is therefore an amorphous compound of refractory metal and silicon and not a "silicide" as that term is used in the semiconductor industry.

To avoid the formation of an oxide layer on the aluminum the refractory metal and silicon compound layer 17 is deposited by sputtering without breaking the system vacuum used in depositing the aluminum layer 16. This ensures good electrical contact between the aluminum 16 and compound layer 17. Other deposition methods may also be used but steps must be taken to ensure that an oxide layer is not formed on the aluminum layer 16 when the compound layer 17 is deposited.

Figure 1C:
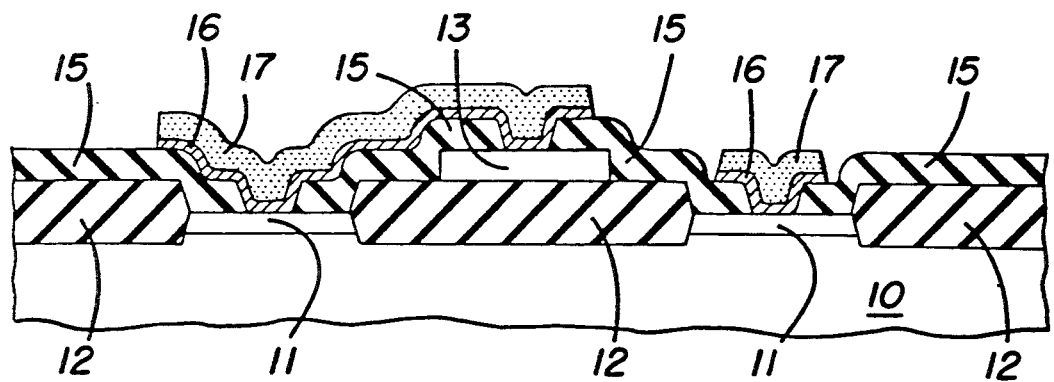

The constraints on the thicknesses for the aluminum layer 16 and compound layer 17 are flexible. In the present exemplary process, a thickness range of 500 to 3000 Angstroms for the aluminum 16 and a range of 1000 to 2500 Angstroms for the compound 17 works quite well. The aluminum-compound composite layer is then defined and etched to yield the desired interconnect structure as shown in FIG. 1C.

The desired aluminum-compound composite layer pattern is defined using conventional photoresist and exposure techniques. The compound layer 17 is etched in a suitable wet or plasma etch. A plasma of $CCl_2F_2 + SF_6$ has been used successfully. The compound layer 17 is then used as a mask to define the aluminum layer 16. Since the aluminum layer 16 is thin, it is possible to get a fine resolution pattern for the aluminum. A phosphoric aluminum etch has proved to be a suitable wet etch in the process. Furthermore, it has been found that the wet etch of the aluminum layer 16 can be done either before or after the removal of the photoresist used in defining the compound layer 17 because the defined compound layer 17 can be used as a mask for the aluminum layer 16.

The aluminum layer 16 in turn provides a nearly perfect etch stop for the plasma etch of the compound layer 17 so that the contact holes 14, 16 (FIG. 1A) do not have to be completely covered by the aluminum-compound composite layer pattern to prevent etching of the exposed silicon substrate 10 or polysilicon layer 13. The aluminum etchant for the layer 16 will not attack silicon or polysilicon material. This permits greater integration of the semiconductor device.

Figure 1D:
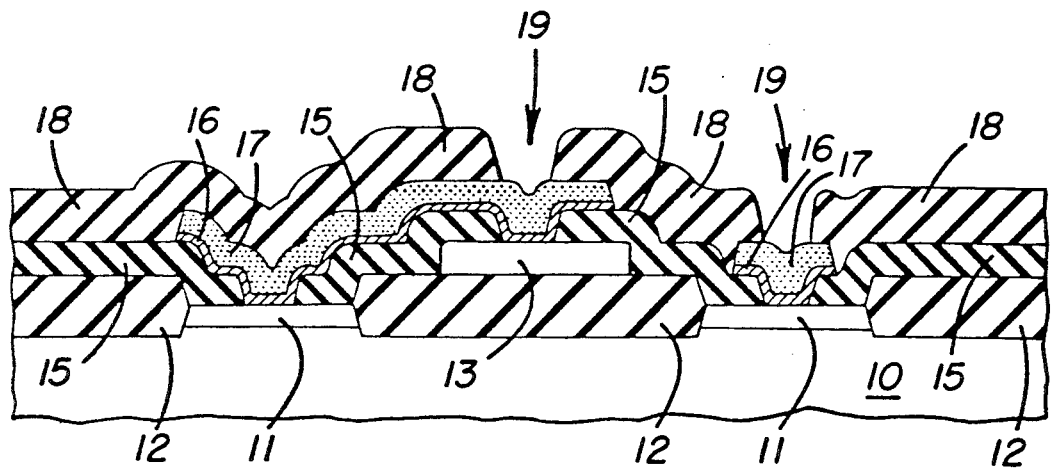

After the aluminum-compound composite layer (FIG. 1B) is deposite and delineated, an interdielectric insulating layer 18 is deposited (FIG. 1D). A silicon dioxide layer from 7,000 to 8,000 Angstroms thick deposited by low pressure chemical vapor deposition techniques has been used. Other thicknesses may also be used. The layer 18 may be formed in an undoped state and in doped states; the layer 18 with 4% and 8% phosphorous concentrations have been used successfully.

Other materials may also be used for the layer 18 but the material should be conformal and compatible with integrated circuit operation and technology. One constraint of the deposition is that the temperature should be below 450° C. so as to avoid excessive aluminum-silicon eutectic formation so that the shallow junctions of the active regions 11 are not shorted out by aluminum spikes into the substrate 10 from the aluminum layer 16.

Using well-known photolithographic techniques the layer 18 is masked and etched so as to open contacts 19 through the layer 18 to the aluminum-compound composite layer. FIG. 1D illustrates the contact openings 19 only in areas over the aluminum-compound composite layer pattern. Contacts may also be opened to diffused or active regions 11, the substrate itself and the polysilicon layer 13.

Figure 1E:
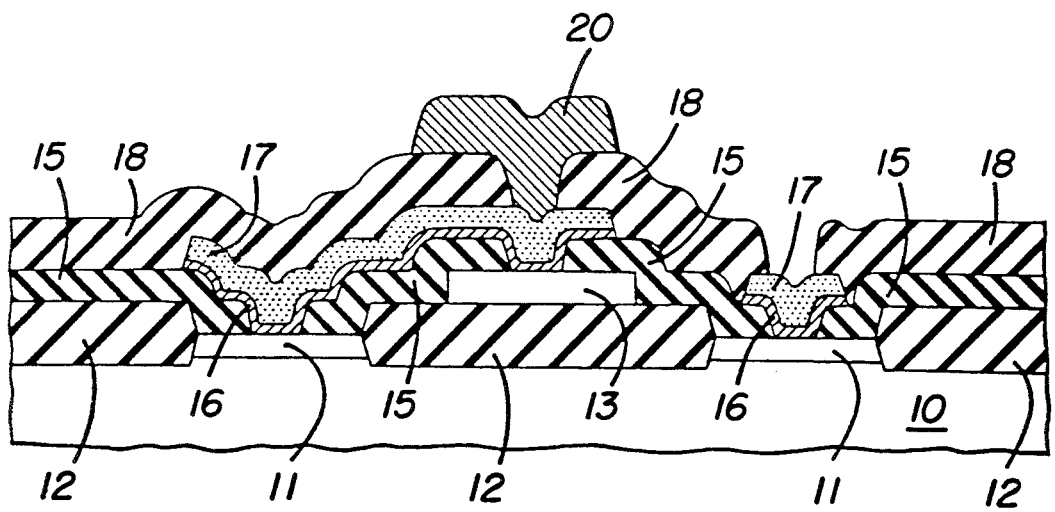

FIG. 1E shows the state of the integrated circuit after a top layer 19 of aluminum has been deposited and defined using standard semiconductor photolithographic technology. It is understood that more alternating layers of aluminum-compound composite and insulating layers may be placed on the interdielectric layer 18 to provide additional interconnecting layers before the top aluminum layer 20 is deposited.

The integrated circuit structure having an intermediate interconnection layer of aluminum compound composite has many advantages over the prior art discussed previously. While the description of the resulting integrated circuit structure is described with reference to FIG. 1E, the structure should not be considered to be as so limited.

Unlike polysilicon layers, the composite layer formed by the aluminum layer 16 and compound layer 17 has low sheet resistances in the range of 0.1 to 0.5 ohms per square, or even less. The composite layer forms the desired low resistance ohmic contacts to the active regions 11 of the substrate 10 through the lower aluminum layer 16. The composite layer can form desirable contacts with N-doped and P-doped silicon, polysilicon, silicide and even other aluminum materials. The present invention is well suited for CMOS technology.

Since the bottom layer 16 is aluminum, "dog bone" contacts are not required. Even if the layer 16 does not completely cover the contact area of the substrate 10, aluminum etchant typically used in defining the layer 16 into an interconnection line will not gouge the substrate 10. Thus the present structure permits greater integration.

No high temperature annealing is required for the composite layer. This is useful in maintaining the speed of the integrated circuit by keeping the junction depths of the active regions shallow and avoiding increased parasitic capacitance.

The composite layer has advantages over an aluminum intermediate interconnection layer. The top layer 17 is a metal and silicon compound which, to permits a smooth coverage by the insulating layer 18. This decreases the likelihood of open circuits in the top conducting layers over the insulating layer 18.

Step coverage problems are also reduced with the present invention. Any inconsistencies of coverage by the aluminum layer 16 is compensated by the compound layer 17.

Furthermore, the layer 17 is a source of silicon for the aluminum layer 16 below. This reduces the possibility of aluminum spiking through shallow P-N junctions in the substrate. The thinness of the aluminum layer 16 also reduces the amount of silicon absorbed from the substrate contact areas.

With the composite layer the top aluminum layer 20 can be reworked, since the compound layer 17 is exposed to the etchants for removing the layer 20. The layer 17 is an effective barrier against the aluminum etchants reaching the underlying layer 16. Furthermore, since the layer 17 acts as a barrier against the etchants for the top layer 20, the top layer contact areas are not required to be a "dog bone", which permits the top aluminum layer to be defined more densely by photolighographic techniques.

Finally, since the interconnect structure has the compound layer 17 electrically in parallel with the aluminum layer 16, it is believed that the likelihood of current density induced aluminum electromigration, which may cause open circuits to form, is reduced. Diffusion barrier layers such as of refractory metals, e.g., titanium, tungsten, molybdenum or alloys of same, can be used as a barrier layer between the aluminum layer 16 and compound layer 17 of the present invention. This barrier technique is well known in the art. See, e.g., U.S. Pat. No. 3,614,547 (MAY).

Although the invention has been described relative to a specific embodiment, it is not so limited and, in the light of the above teaching, numerous variations and modifications thereof will be readily apparent to those skilled in the art. It is therefore to be understood that within the scope of the appended claims the invention may be practiced otherwise than as specifically described.

What is claimed is:

1. An improved interconnect structure device for integrated circuits having a substrate, said substrate having a surface, a plurality of active circuit component regions within the surface of said substrate, and having a first insulation layer over said substrate surface having apertures over preselected active regions, said improvement characterized by:

a first layer of aluminum on said first insulating layer and in said apertures; and
  a layer of an amorphous compound of refractory metal and silicon on said first aluminum layer,
  wherein said aluminum layer and said compound layer form an interconnect structure on said first insulating layer and in said apertures for coupling said preselected active regions.

2. The device as in claim 1 wherein said layer of aluminum has a thickness in the range of 1000 to 2500 Angstroms.

3. The device as in claim 1 wherein said layer of said compound has a thickness in the range of 1000 to 2500 Angstroms.

4. The device as in claim 1 further comprising:
  a second insulating layer over said first insulating layer and said interconnect structure, and
  a second interconnect structure of aluminum on said second insulating layer further comprising said active regions and said first interconnect structure.

5. The device as in claim 4 wherein said metal in said compound layer comprises a refractory metal from the group consisting of molybdenum and tantalum.

6. The device as in claim 5 wherein said first aluminum layer has a thickness in the range of 500 to 3000 Angstroms and said compound layer has a thickness in the range of 1000 to 2500 Angstroms.

7. An integrated circuit having a silicon substrate, said substrate having a surface, a plurality of active regions within the surface of said substrate, a first silicon dioxide layer over said substrate surface and having at least one aperture exposing a preselected active region, a first conducting layer on said first silicon dioxide layer in a first predetermined pattern so that said first conducting layer contacts said preselected active region, said first conducting layer comprising:

- a first layer of aluminum on said first silicon dioxide layer, and
- a layer of an amorphous compound of refractory metal and silicon on said first aluminum layer.

8. The device as in claim 7 further comprising:
- a second silicon dioxide layer over said first silicon dioxide layer and said first conducting layer and said first conducting layer, said second silicon dioxide layer having at least one opening exposing a preselected portion of said first conducting layer, and
- a second layer of aluminum on said second silicon dioxide layer in a second predetermined pattern so that said second aluminum layer contacts said first conducting layer.

9. The device as in claim 8 further comprising:
- a polysilicon layer in a third predetermined pattern between said first silicon dioxide layer and said substrate, and
- a third silicon dioxide layer between said polysilicon layer and said substrate.

10. An interconnect structure for an integrated circuit having a substrate, at least two active regions provided in the substrate, and an insulating layer provided on the substrate, the insulating layer having windows exposing selected active regions, comprising:

- an aluminum layer, provided on the insulating layer and in the windows, contacting the selected active regions; and
- a layer comprising an amorphous compound of a refractory metal and silicon provided on said aluminum layer, said aluminum and amorphous compound layers providing an electrical interconnection between the selected active regions.

11. An interconnect structure according to claim 10, wherein said electrical interconnection provided by said aluminum and amorphous compound layers has a sheet resistance of less than 0.5 ohms per square.

12. An interconnect structure according to claim 10, wherein:
said aluminum layer has a thickness of approximately 1000–2500 Angstroms; and
said amorphous compound layer has a thickness of approximately 1000–2500 Angstroms.

* * * * *